United States Patent
Kiyofuji et al.

(10) Patent No.: US 8,680,880 B2
(45) Date of Patent: Mar. 25, 2014

(54) METHOD AND APPARATUS FOR TESTING INTEGRATED CIRCUIT

(75) Inventors: Hidehiro Kiyofuji, Oita (JP); Tetsuya Iwabuchi, Aomori (JP); Toshiyuki Kudo, Aomori (JP); Seiji Kanazawa, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 370 days.

(21) Appl. No.: 12/637,656

(22) Filed: Dec. 14, 2009

(65) Prior Publication Data

US 2010/0164520 A1     Jul. 1, 2010

(30) Foreign Application Priority Data

Dec. 26, 2008   (JP) .................................. 2008-332586

(51) Int. Cl.
   *G01R 31/20*   (2006.01)
(52) U.S. Cl.
   USPC ............ 324/754.01; 324/754.03; 324/764.01; 324/756.01; 324/756.03; 324/756.07
(58) Field of Classification Search
   USPC ................ 324/754.01–754.03, 764.01, 703, 324/750.11, 762.01, 754.07
   See application file for complete search history.

(56) References Cited

U.S. PATENT DOCUMENTS

| 2005/0083073 A1* | 4/2005 | Nihei et al. ................... 324/758 |
| 2008/0116925 A1* | 5/2008 | Sunohara et al. ............. 324/761 |
| 2008/0139017 A1  | 6/2008 | Kiyofuji et al. |

FOREIGN PATENT DOCUMENTS

| JP | 04-359445 | 11/1992 |
| JP | 2002-14047 | 1/2002 |
| JP | 2005-201844 | 7/2005 |
| JP | 2007-183194 | 7/2007 |
| JP | 2007208138 A * | 8/2007 |
| JP | 2008-145238 | 6/2008 |

* cited by examiner

*Primary Examiner* — Arleen M Vazquez
*Assistant Examiner* — Son Le
(74) *Attorney, Agent, or Firm* — Graybeal Jackson LLP (57) ABSTRACT

An embodiment of a method for testing an integrated circuit comprises a first step for determining at least one of a group selected from whether or not the chuck top receiving the integrated circuit exists near a probe card which transmits and receives electrical signals to and from the integrated circuit, whether or not the integrated circuit is under testing, and whether or not the probe card has a given temperature, and a second step for adjusting power for heating to be supplied to a heating element provided in the probe card according to the determination result in the first step.

20 Claims, 4 Drawing Sheets

ID CIRCUIT

PRIORITY CLAIM

The instant application claims priority to Japanese Patent Application No. 2008-332586, filed Dec. 26, 2008, which application is incorporated herein by reference in its entirety.

TECHNICAL FIELD

An embodiment of the subject matter relates to a method and an apparatus for electrically testing an integrated circuit.

BACKGROUND

An uncut integrated circuit formed in a semiconductor wafer, an integrated circuit cut into chip-like sections, and an integrated circuit (i.e., a device under testing) such as an integrated circuit cut into chip-like sections and packaged or molded are subjected to a test as to whether or not they provide performance as per specification.

A probe card used in such a test generally comprises a probe base plate having a plurality of signal paths, i.e., electrically-conductive paths, and a plurality of contacts arranged on one face of the probe base plate and electrically connected to the conductive paths.

As such a probe base plate are used a wiring board made of glass epoxy resin, a ceramic base plate made of ceramic, a flexible multilayer wiring board made of an electrically insulated resin such as polyimide resin, or a base plate for combined use with the flexible multilayer wiring board disposed on the underside of the ceramic base plate.

Currently, testing of an integrated circuit under high temperature is carried out. In this case, an integrated circuit is heated to a given temperature by a heating element provided in a stage where the integrated circuit is disposed, whereby a probe base plate where contacts are disposed is also heated upon receipt of the heat from the stage and the integrated circuit. As a result, the integrated circuit and the probe base plate are thermally expanded.

If, however, an amount of thermal expansion of the integrated circuit and that of the probe base plate are different, a relative physical relation between an electrode of the integrated circuit and a tip of the contact changes, so that there unavoidably may exist some contacts whose tips are not pressed against the electrodes of the integrated circuit.

Thus, a test apparatus is proposed wherein a heating element disposed within a probe base plate is heated to heat the probe base plate, thereby adjusting the temperature of the probe base plate (Japanese Patent Appln. Public Disclosure No. 4-359445), which is incorporated by reference.

However, in the test apparatus as described in Japanese Patent Appln. Public Disclosure No. 4-359445, only a single metal layer is provided in the probe base plate as a heating element. Thus, it takes a long time for the probe card, particularly a ceramic base plate, to be heated to a given temperature, so that its operating efficiency is low.

For instance, in a test apparatus to move a stage relative to the probe card every time a test of wafer is finished, the probe card is exposed to ambient temperature whenever the stage is separated from the probe card, so that the temperature of the probe card lowers.

In an apparatus to test multiple wafers by dividing them into lots and to test per lot, each lot including a plurality of wafers, a probe card is exposed to ambient temperature not only each time a test of one wafer is finished but also every time a stage is moved to replace the wafers per lot. In such an apparatus, the temperature of the probe base plate lowers while the probe card is exposed to ambient temperature.

In view of the above, in a conventional test apparatus, the temperature of a probe card should be raised again to a given one for the subsequent wafer test. In the conventional test apparatus, however, it takes a long time to raise the lowered temperature of the probe card again to a given temperature, so that the test efficiency is remarkably low.

Also, in the conventional test apparatus, if power for heating is supplied to a heater though the test signals are fed to an integrated circuit, the test signals are greatly affected by the power for heating, so that accurate test results may be obtainable.

SUMMARY

An embodiment of a probe card is provided which can raise the temperature of a probe base plate to a given one in a short time.

A method for testing an integrated circuit according to an embodiment comprises:

a first step to determine at least one selected from a group including whether or not a chuck top which receives the integrated circuit exists near the probe card involved in transfer and receipt of electrical signals to or from the integrated circuit, whether or not the integrated circuit is under testing, and whether or not the probe card has an adequate temperature; and a second step to adjust electric power for heating to be fed to a heating element provided in the probe card in accordance with the determination result in the first step.

An embodiment of the apparatus for testing an integrated circuit comprises:

a probe card including a probe base plate having a plurality of conductive paths and a plurality of contacts disposed on one face of the probe base plate and electrically connected to the conductive paths;

a chuck top in which said integrated circuit is to be disposed is movable among a test site where the received integrated circuit opposes said probe card, a non-test site where the received integrated circuit does not oppose said probe card, and a retreat position where the received integrated circuit does not oppose said probe card;

a heating element disposed on the probe base plate so as to generate heat by power for heating supplied through the power supply path;

a first sensor for outputting an electrical signal to be used for determining whether or not the chuck top is positioned near the probe card;

a second sensor disposed on the probe card to detect the temperature of the probe card; and a controller for controlling a test signal to be supplied to the probe card and controlling the power for heating to be supplied to the heating element, for determining on the basis of an output signal from the first sensor at least one selected from a group of whether or not the chuck top exists near the probe card, whether or not the test signal is fed to the integrated circuit, and determining, on the basis of an output signal from the second sensor, whether or not the probe card has a given temperature, and adjusting the amount of supply of the power for heating in accordance with the determination result.

A test apparatus of the integrated circuit according to another embodiment comprises:

a probe card including a probe base plate having a plurality of conductive paths and power supply paths as well as a plurality of contacts arranged on one face of the probe base plate and electrically connected to the conductive paths;

a chuck top in which said integrated circuit is to be disposed is movable among a test site where the received integrated circuit opposes said probe card, a non-test site where the received integrated circuit does not oppose said probe card, and a retreat position where the received integrated circuit does not oppose said probe card;

a heating element disposed on the probe base plate so as to generate heat by power for heating supplied through the power supply path;

a sensor for outputting an electrical signal to be used for determining whether or not the chuck top is positioned near the probe card; and a controller for controlling a test signal to be supplied to the probe card and controlling the power for heating to be supplied to the heating element, for determining on the basis of an output signal from the sensor whether or not the chuck top exists near the probe card, whether or not the test signal is fed to the integrated circuit, and adjusting the amount of supply of the power for heating in accordance with both determination results.

A test apparatus of the integrated circuit according to yet another embodiment comprises:

a probe card including a probe base plate having a plurality of conductive paths and power supply paths as well as a plurality of contacts arranged on one face of the probe base plate and electrically connected to the conductive paths;

a chuck top in which said integrated circuit is to be disposed is movable among a test site where the received integrated circuit opposes said probe card, a non-test site where the received integrated circuit does not oppose said probe card, and a retreat position where the received integrated circuit does not oppose said probe card;

a heating element disposed on the probe base plate so as to generate heat by the power for heating supplied through the power supply paths;

a sensor disposed on the probe card so as to detect the temperature of the probe card; and a controller for controlling a test signal to be supplied to the probe card and controlling the power for heating to be supplied to the heating element, for determining on the basis of an output signal from the sensor whether or not the probe card has a given temperature, and adjusting the amount of supply of the power for heating in accordance with both determination results.

The first step may include determining whether or not the chuck top exists near the probe card on the basis of an output signal from a sensor provided in the probe card or the chuck top.

The first step may include determining whether or not the chuck top exists near the probe card, and the second step may include adjusting the power for heating supplied to the heating element to a given value when the chuck top does not exist near the probe card.

In the foregoing case, the second step may further include adjusting the power for heating to be supplied to the heating element to an adequate value when the chuck top exists near the probe card.

The first step may include determining whether or not the test is being conducted, and the second step may include adjusting the power for heating to be supplied to the heating element to an adequate value when the test is not underway.

In the foregoing case, the second step may further include adjusting the power for heating to be supplied to the heating element to an adequate value when the test is being conducted.

The first step may include determining whether or not the probe card has a given temperature, and the second step can include adjusting the power for heating supplied to the heating element to the given temperature when the probe card does not have a given temperature.

In the foregoing case, the second step may further include adjusting the power for heating to be supplied to the heating element to 0 when the probe card has a given temperature.

The first step may include determining whether or not the chuck top exists near the probe card and whether or not the test is being conducted, while the second step may include adjusting the amount of supply of the power for heating to the heating element to a given value when the chuck top is neither near the probe card nor under testing.

In the above case, the second step may further include adjusting the amount of the power supply for heating to the heating element to an adequate value when the chuck top exists near the probe card but not under testing.

The first step can include determining whether or not the chuck top exists near the probe card and whether or not the temperature is proper, while the second step may include adjusting the amount of the power supply for heating to the heating element to a given value when the chuck top does not exists near the probe card nor the temperature is proper.

In the foregoing case, the second step may further include adjusting the amount of the power supply for heating to the heating element to a given value when the chuck top exists near the probe card but the temperature is not proper.

The first step may include determining whether or not the test is being conducted and the temperature is proper, while the second step may include adjusting the amount of the power supply for heating to the heating element to a given value when the test is not being conducted and the temperature is not proper.

In the foregoing case, the second step may include adjusting the amount of supply of the power for heating to the heating element to an arbitrary value when the test is being conducted and the temperature is not proper.

The first step may include determining whether or not the chuck top exists near the probe card, whether or not the test is being conducted, and whether the temperature of the probe card is proper, while the second step may include adjusting the amount of the power supply for heating to a given value when the chuck top does not exist near the probe card, nor under testing, nor, further, the temperature is proper.

The first step may include determining whether or not the chuck top exists near the probe card, whether or not the test is being conducted, and whether or not the temperature of the probe card is proper, while the second step may include adjusting the amount of the power supply for heating to an adequate value when the chuck top exists near the probe card and the test is being conducted, and further, when the temperature is not proper.

The method of electrical testing may further include supplying the power for heating from an electrical source circuit and an electrical source circuit selected from those other than the one for the probe card.

In certain embodiments, depending on whether or not the chuck top exists near the probe card, whether or not the integrated circuit is under testing, and whether or not the probe card has a given temperature, the amount of the power for heating to be supplied to the heating element is adjusted to adjust the temperature of the probe card. As a result, the probe card is effectively heated.

If the power for heating is supplied to the heating element when the chuck top does not exist near the probe card, the probe card may be heated, so that the probe card is more effectively heated.

If the amount of the power supply for heating when the chuck top exists near the probe card is adjusted to a smaller value than the amount of supply when the chuck top does not exist near the probe card, the influence on a test signal by the power for heating may become less.

When a test is being conducted, by adjusting the amount of the power supply for heating to the heating element to a smaller value than the amount of supply when the chuck top does not exist near the probe card, especially, to 0, the influence on a test signal by the power for heating may become less.

When the temperature of the probe card is not proper, by adjusting the amount of the power supply for heating to the heating element to a smaller value than one when the chuck top does not exist near the probe card, the influence on a test signal by the power for heating may become less.

DETAILED DESCRIPTION

Figure 1:
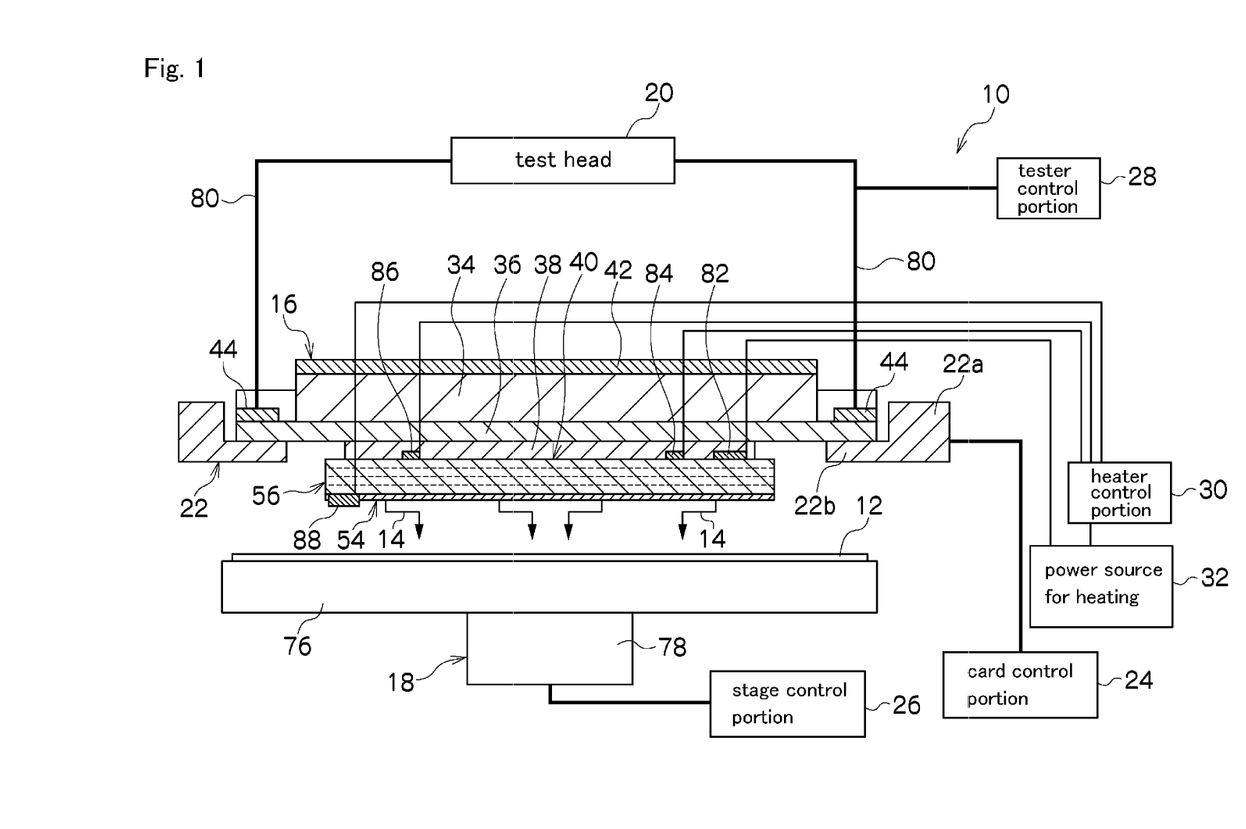
FIG. 1 is a diagram showing an embodiment of a test apparatus using a probe card.

Referring to FIG. 1, an embodiment of a test apparatus 10 uses a circular plate-shaped semiconductor wafer 12 as a device under test, and tests or examines a plurality of integrated circuits formed in a wafer 12, at one time or in several separate times. Each integrated circuit has a plurality of electrodes (not shown), such as pad electrodes, on the upper face.

Figure 2:
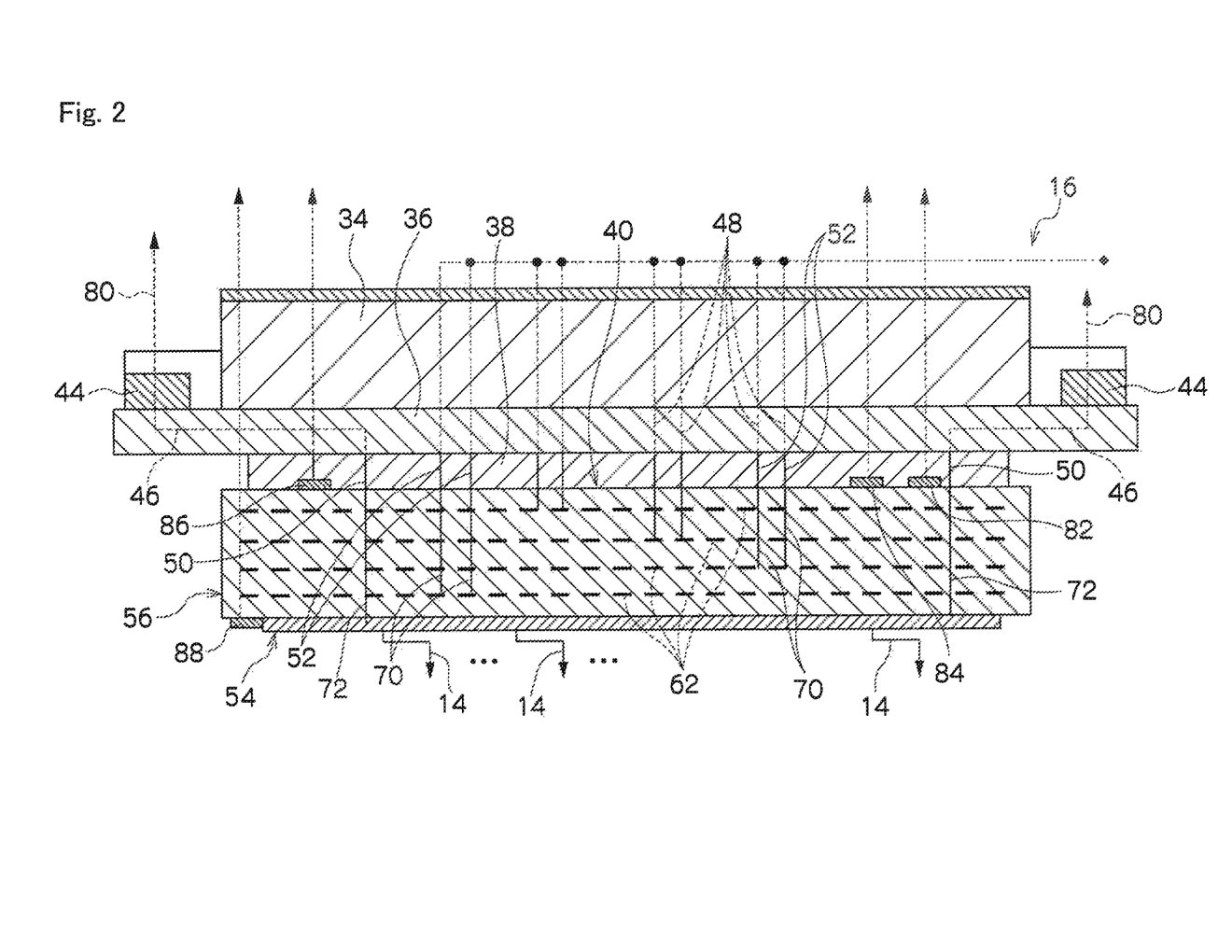
FIG. 2 is a sectional view showing an embodiment of the probe card used in the test apparatus shown in FIG. 1.

Referring to FIGS. 1 and 2, an embodiment of the test apparatus 10 comprises: an electrical connecting apparatus, i.e., probe card 16, provided with a plurality of plate-like contacts 14; an inspection stage 18 where the wafer 12 is disposed; a test head 20 electrically connected to the probe card 16; a card holder 22 for receiving the probe card 16 at its outer rim portion; a card control portion 24 for controlling the height or inclination of the card holder 22 relative to the inspection stage 18; a stage control portion 26 for controlling the position of the inspection stage 18 relative to the card holder 22; a tester control portion 28 for controlling the test head 20 to give and receive test signals to and from the contacts 14 (i.e., feed signals to be supplied to the integrated circuit for testing and electrical signals such as answer signals to the feed signals from the integrated circuit); a heater control portion 30 for controlling temperature of the probe card 16; and a power source for heating 32 for supplying electric power for heating (heating current).

In the illustration, each contact 14 uses a crank-shaped plate-like probe. An example of such a contact 14 is described, for example, in JP Patent Appln. Public Disclosure No. 2005-201844, which is incorporated by reference.

Each contact 14 may be, however, a heretofore known one such as a probe made of a thin metallic wire such as tungsten line, a plate-like probe made by using photolithography technology and deposition technology, a probe with a plurality of wirings formed on one face of an electrically insulated sheet such as polyimide and with part of the wirings used as a contact.

The probe card 16 includes: a reinforcing member 34 having a flat underside; a circular flat plate-like wiring board 36 held on the underside of the reinforcing member 34; a flat plate-like electrical connector 38 disposed on the underside of the wiring board 36; a probe base plate 40 disposed on the underside of the electrical connector 38; and a circular plate-like cover 42 disposed on the reinforcing member 34. These members 34 through 42 are assembled separably and firmly with a plurality of bolts.

The reinforcing member 34 is made of a metal material such as a stainless steel plate. For instance, as described in JP Patent Appln. Public Disclosure No. 2008-145238, which is incorporated by reference, the reinforcing member 34 has an inner annular portion, an outer annular portion, a plurality of coupling portions for coupling both annular portions, a plurality of connections for combining both annular portions, a plurality of extensions extended radially outward from the outer annular portion, and a central frame portion integrally continuing to the inside of the inner annular portion, and can be configured so that a gap between those portions can act as a space opening both upward and downward.

Also, as described in JP Patent Appln. Public Disclosure No. 2008-145238, which is incorporated by reference, for example, it is possible to dispose an annular thermal deformation control member for controlling thermal deformation of the reinforcing member 34 on the upside of the reinforcing member 34 and dispose the cover 42 on the thermal deformation control member.

In the illustration, the wiring board 36 is made of an electrically insulating resin such as glass epoxy resin into a disk-like shape and has a plurality of internal wirings 46 to be used for transfer of test signals to the contacts 14, and a plurality of power supply paths 48 to be used for supplying electric power for heating.

In the annular rim portion of the upside of the wiring board 36 are disposed multiple connectors 44 to be connected to the test head 20. Each connector 44 has a plurality of terminals (not shown) electrically connected to the internal wirings 46.

The reinforcing members 34 and the wiring board 36 are coaxially combined by a plurality of screw members (not shown) with the underside of the reinforcing member 34 and the upside of the wiring board 36 brought into contact with each other.

The electrical connector 38 may be a known one, as described, for example, in JP Patent Appln. Public Disclosure No. 2008-145238, which is incorporated by reference. The electrical connector 38 may be provided with a known plural connecting pins 50, 52 such as pogo pins (each of which has an upper pin member and a lower pin member extending, respectively, upward and downward with a spring in an electrically insulating pin holder therebetween). The internal wirings 46 and the power supply paths 48 of the wiring board 36 are electrically connected to conductive paths 72 and power supply paths 70, which will be explained later, of the probe base plate 40, respectively, by means of the connecting pins 50 and 52.

The electrical connector 38 is combined with the underside of the wiring board 36 at the pin holder by a plurality of screw members and suitable members (neither are shown) such that the upsides of the pin holders abut on the underside of the wiring board 36.

Further, each of the connecting pins 50 and 52 has the upper pin member and lower pin member with a spring therebetween. The upper pin member is pressed against a terminal portion (not shown) continuous to the lower end of the internal wiring 46 of the wiring board 36 or the power supply path 48, while the lower pin member is pressed against another terminal portion provided on the upside of the probe base plate 40.

In the illustration, the probe base plate 40 is a base plate for combined use having a flexible multilayer sheet 54 made of an electrically insulating resin such as polyimide resin on the underside of a multilayer ceramic base plate 56 and the contacts 14 cantilevered on the underside of the multilayer sheet 54.

The multilayer sheet 54 has a publicly known configuration including a plurality of internal wirings (not shown) inside and a plurality of probe lands (not shown) electrically connected to the internal wirings and is formed integrally with the ceramic base plate 56.

Each contact 14 is cantilevered on the probe land with its front end (tip) projected downward by an electrically conducting bond such as soldering, laser welding and the like.

Figure 3:
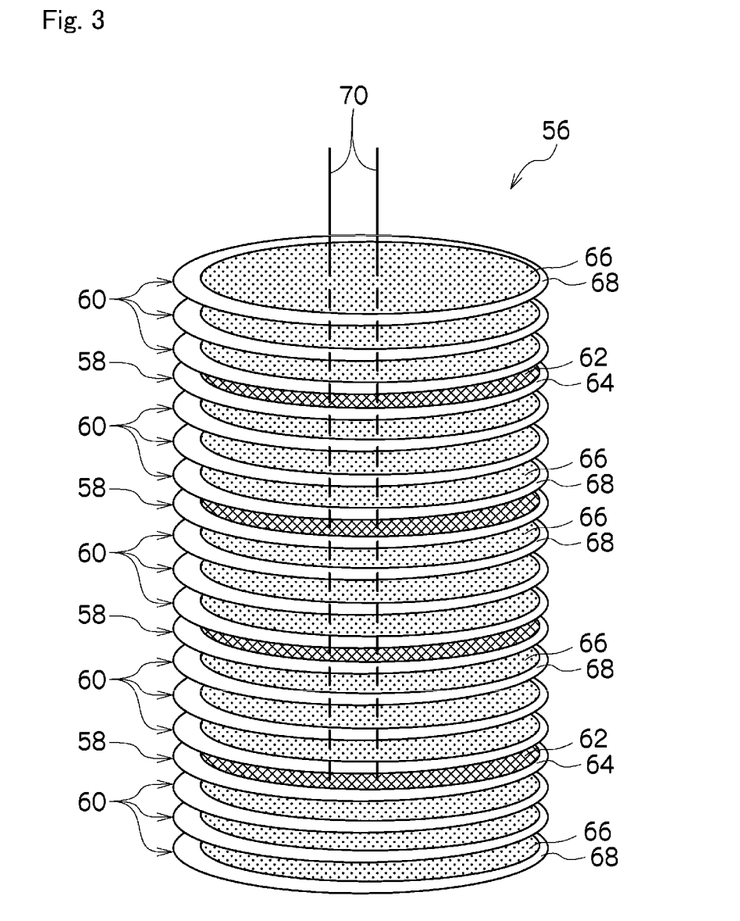
FIG. 3 is an exploded perspective view showing an embodiment of a ceramic base plate used in the probe card shown in FIG. 2.

As shown in FIG. 3, the ceramic base plate 56 may have a plurality of heat generating layers 58 and a plurality of conductive layers 60. In the example of FIG. 3, there are provided a plurality of (four in the illustration) heat generating layers 58 at intervals in the thickness direction (in the illustration, vertical direction), and a plurality of (three in the illustration) conductive layers 60, respectively, between adjacent heat generating layers 58, as well as plural layers (three in the illustration), respectively, on the upside of the uppermost heat generating layer 58 and on the underside of the lowest heat generating layer 58.

Each heat generating layer 58 has a heating element 62 formed on one face of a thin ceramic layer 64. The heating element 62 of each heat generating layer 58 may have, as shown in FIG. 5, an arbitrary pattern such as unicursal, a concentric circle or the like.

In contrast to this, each conductive layer 60 has the wiring 66 like a wiring pattern formed on one face of a thin ceramic layer 68. Each wiring 66 of the ceramic base plate 56 is electrically connected to the internal wiring of the multilayer sheet 54 and used for transfer of a test signal to the contacts 14 together with the internal wiring.

Each heating element 62 is electrically connected to a pair of power supply paths 70 which extend through the heat generating layers 58 and conductive layers 60 in the thickness direction. The heating element 62 may be connected to a pair of power supply paths provided at each heating element or may be connected in parallel to the pair of power supply paths 70 common to the plural heating elements 62.

Each wiring 66 is electrically connected to a conductive path 72 extending through the heat generating layers 58 and conductive layers 60 in the thickness direction. The power supply paths 70 and conductive paths 72 are, respectively, formed by combination of conductive via holes formed in the heat generating layers 58 and conductive layers 60.

Each conductive path 72 is electrically connected to the wiring 66 of the corresponding conductive layer 60 but is not electrically connected to the power supply path 70 of the conductive layer. Consequently, each heat generating layer 58 is provided with a through hole which allows the conductive path 72 to penetrate without contacting the heating element 62, and an electrically insulating area (not shown) such as a pattern non-existing area where no heating element 62 exists.

On the contrary, while each power supply path 70 is electrically connected to the heating element 62 of the corresponding heat generating layer 58, it is not electrically connected to the wiring 66 of the conductive layer 60. Therefore, each conductive layer 60 is provided with a through hole which allows the power supply path 70 to penetrate without contacting the wiring 66, and another electrically insulating area (not shown) such as a wiring non-existing area having no wiring 66.

In place of an electrically insulating layer, the conductive layer 60 may be used. In such a case, it is possible to provide a plurality of insulating layers or a single insulating layer between the heat generating layers 58 adjacent to each other in the thickness direction, and on each of the upside of the uppermost heat generating layer 58 and the underside of the lowest heat generating layer 58. The above-mentioned electrically insulating areas, respectively, provided between the heat generating layers 58 adjacent to each other in the thickness direction, on the upside of the uppermost heating layer 58 and on the underside of the lowest heat generating layer 58 are not necessarily through holes.

However, the conductive paths 72 of the insulating layers adjoining in the thickness direction are connected to each other without contacting the heating element 62 of the heat generating layer 58. Consequently, each heat generating layer 58 has the above-mentioned pattern non-existing areas. Thus, a test signal passing through the conductive path 72 is not under the influence of the electric power for heating which passes the power supply path 70.

The probe base plate 40 such as mentioned above is combined with the underside of the wiring base plate 36 with a plurality of screw members and suitable members (neither is shown) such that the upside of the ceramic base plate 56 is pressed against the underside of the electric connector 38. Thus, the lower ends of the connection pins 50 and 52 of the electrical connector 38 are respectively pressed against the upper ends of the power supply path 70 and conductive path 72 to be electrically connected to the power supply path 70 and conductive path 72.

Referring again to FIGS. 1 and 2, in an embodiment the card holder 22 is made of an electrically insulating material and has a ring-like rim portion 22a and an upward stage portion 22b extending from the lower end portion of the rim portion 22a. The stage portion 22b is shaped like a ring like an inward flange and receives the underside of the outer rim portion of the wiring board 36.

The probe card 16 is attached to the stage portion 22b of the card holder 22 with a plurality of screw members (not shown) in the extended portion of the reinforcing member 34 such that the probe card 16 is situated under the housing of the test head 20.

The card holder 22 is attached to the frame or the housing of the test apparatus 10 through a card support mechanism (not shown) which changes inclination of the card holder 22 relative to the inspection stage 18.

The above-mentioned card support mechanism, controlled by the card control portion 24 prior to a test, in particular, of one lot or a test of one device under test, changes the height or inclination of the card holder 22, eventually, of the probe card 16, relative to the inspection stage 18. Thus, the probe card 16 is positioned to be at a given height position relative to the wafer 12 where an imaginary tip plane formed by the tips of the contacts 14 is received in a chuck top 76.

A card support mechanism such as above is described, for example, in JP Patent Appln. Public Disclosures No. 2002-14047, No. 2007-183194, etc, which are incorporated by reference.

The inspection stage 18 has a stage, that is, the chuck top 76, for releasably adsorbing the wafer 12 vacuum-wise, and a chuck top moving mechanism 78 for moving the chuck top 76 three-dimensionally in the longitudinal, lateral and vertical directions relative to the probe card 16 as well as for angularly rotating about a θ-axis extending in the vertical direction.

The inspection stage 18 is moved longitudinally and laterally relative to the probe card 16 by a stage moving mechanism (not shown). Thus, the inspection stage 18 is prevented from moving longitudinally and laterally during the test of the wafer 12, but is moved longitudinally and laterally by the stage moving mechanism for replacing the wafer of one lot to be tested.

In addition, the inspection stage 18 is moved longitudinally and laterally by the above-mentioned stage moving mechanism for replacement of the wafer to be tested during the test of the wafer of one lot.

Instead of providing such a stage moving mechanism as described above, it is possible to use a function of the chuck top moving mechanism 78 for moving the chuck top 76 longitudinally and laterally.

Prior to the test of the wafer 12, the chuck top moving mechanism 78, controlled by the stage control portion 26, moves the chuck top 76 three-dimensionally and angularly rotate it about the θ-axis. Thus, the wafer 12 received by the chuck top 76 is positioned such that an electrode of an integrated circuit provided therein is opposed to the tip of the contact 14.

When replacing the wafer to be tested, the inspection stage 18, before being moved longitudinally and laterally by the above-mentioned stage moving mechanism, is maintained in a state that the chuck top 76 is lowered by the chuck top moving mechanism 78 to a position where the wafer 12 is not brought into contact with the contact 14.

The test head 20 is a known one including a plurality of circuit boards where completed integrated circuits are placed on a support base plate like a wiring board and a box for accommodating these circuit boards, and is disposed above the probe card 16.

In the illustration, the integrated circuit of each circuit board is electrically connected to the internal wiring 46 of the wiring board 36 through wiring 80 and the connector 44. Thus, the integrated circuit of each circuit board, controlled by the tester control portion 28 at the time of an actual test, delivers test signals to the integrated circuit of the wafer 12 through the probe card 16.

The power source for heating 32 supplies heating power to the power supply path 70 through a thermal fuse 82 provided in the ceramic base plate 56. Though not shown, the thermal fuse 82 is disposed in a supply path of current for heating from the power source for heating 32 to the power supply path 70.

The thermal fuse 82 comes down and breaks an electric line for source for heating between the power source for heating 32 and the power supply path 70 like a general electrical fuse when a temperature of the ceramic base plate 56 exceeds a tolerance. Thus, the safety of the probe card 16 is maintained.

The source for heating 32 may be used exclusively for the probe card 16. Thus, the above-mentioned test apparatus 10, particularly, the probe card 16 may be easily applied to an existing test apparatus. However, a circuit other than one exclusively used for the probe card 16 such as the power circuit of the tester may be used as a power source for heating.

The probe card 16 also comprises the probe base plate 40, in particular, a temperature sensor 84 and an overheat protecting member 86, respectively, disposed on the upside of the ceramic base plate 56, and a stage sensor 88 provided on the probe base plate 40, particularly, on the underside of the multilayer sheet 54. These sensors 84, 88 and the member 86 are connected to the heater control portion 30.

The temperature sensor 84 detects the temperature of the probe card 16, in particular, of the probe base plate 56 and supplies an electrical signal corresponding to the temperature of the probe base plate 56 to the heater control portion 30. The heater control portion 30 controls the power source for heating 32 so as to output a given electric power for heating on the basis of a signal from the temperature sensor 84.

The overheat protecting member 86 is a circuit-breaking member such as an IC relay, a semiconductor relay, a transistor or the like. The heater control portion 30 determines whether the temperature of the probe base plate 56 is over a tolerance on the basis of the signal from the temperature sensor 84 and, if over, actuates the overheat protecting member 86 to break the supply path for the power for heating.

As the temperature fuse 82 and the overheat protecting member 86, a circuit-breaking member such as bimetal may be used instead of using a circuit-breaking member such as mentioned above. In that case, when the temperature of the probe base plate 56 exceeds the tolerance depending on the circuit-breaking member, the circuit-breaking member itself opens circuit and breaks the supply path of the power for heating. It is confirmed at the heating control portion 30 that the circuit of the circuit-breaking member at the time opened.

Whichever type of the above-mentioned overheat protection members 86 may be used, the safety of the probe card 16 can be maintained. Thus, the safety of the probe card 16 is doubled, combined by opening circuit of the temperature fuse 82 when the temperature of the probe base plate 56 exceeds the tolerance and breaks the feeding path of the heating power.

The heater control portion 30, particularly, when the temperature of the probe base plate 56 is over the tolerance, outputs a signal to block the supply of the electric power for heating to power source for heating 32. Such a function of the heater control portion 30 further enhances the safety of the probe card 16.

The stage sensor 88 generates an electrical signal to be used in determining whether or not the inspection stage, particularly, the chuck top 76, is situated near (particularly, under) the probe base plate 40 and outputs the electrical signal to the heater control portion 30.

As the stage sensor 88, a capacitance sensor for detecting an electrical capacitance between the probe base plate 40 and the chuck top 76 may be used. However, it is also possible to use sensors other than the capacitance sensors, such as limit switch, area sensor, line sensor and the like, as the stage sensor 88.

Applying current to the heating element 62 may be made in an arbitrary period while no test is being conducted, such as when the chuck top 76 does not exist under the probe card 16, when the chuck top 76 is moved to come under the probe card 16, and when a test electrical signal is not supplied to the wafer 12, and so forth.

Depending on whether or not the chuck top 76 exists near the probe card 16 and whether or not the probe card 16 has a given temperature, the amount of the power for heating to be supplied to the heating element 62 is adjusted, and the temperature of the probe card 16 is adjusted. As a result, the probe card 16 is effectively heated.

The tester control portion 28 determines whether or not the inspection stage 18, particularly, the chuck top 76, exists near (particularly, below) the probe card 16 (particularly, the probe base plate 40), whether or not it transmits and receives test signals to and from the integrated circuit (whether it is under testing), and whether or not the probe card 16 (particularly, the probe base plate 40) has a given temperature, and adjusts the power for heating to be supplied to the heating element 62 according to the determination result.

Whether or not the chuck top 76 exists near the probe card 16 may be determined by using an output signal from the sensor 88. Also, whether or not a test is being conducted can be determined by whether or not the tester control portion 28 itself is transmitting or receiving a test signal. Further, whether or not the probe card 16 has a given temperature may be determined by using an output signal from the sensor 84.

Concrete adjustment of the power for heating by the tester control portion 28 may be made, based on any of one, a combination of two and a combination of three of determining whether or not the chuck top 76 exists near the probe card 16, determining whether or not a test is being conducted, and determining whether or not the probe card 16 has a given temperature.

In the following is explained a method of controlling (namely, a method of adjusting) the power for heating by the tester control portion 28. Each example is parenthesized.

[Examples Resulting from One Determination]

| Form | Determination & results | Adjustment of power for heating |
|---|---|---|
| 1A: | near? N | given value (for heating up to or maintaining at given temperature) |
| 1B: | near? Y | adequate value (smaller than 1A, including 0) |
| 2A: | under testing? N | adequate value (for heating up to or maintaining at given temperature) |
| 2B: | under testing? Y | adequate value (smaller than 2A, including 0) |
| 3A: | adequate temperature? N | adequate value (for heating up to or maintaining at given temperature) |
| 3B: | adequate temperature? Y | adequate value because of no need to adjust (including 0) |

[Example by Combination of Two Determination Results]

| Form | Determination & results | Adjustment of power for heating |
|---|---|---|
| 4A: | near? Y + testing? Y | adequate value (smaller than 4B, including 0) |
| 4B: | near? Y + testing? N | adequate value (smaller than 4D, including 0) |
| 4C: | near? N + testing? Y | adequate value (not existing in effect) |
| 4D: | near? N + testing? N | given value (for heating up to or maintaining at given temperature) |
| 5A: | near? Y + adequate temperature? Y | adequate value because of no need to adjust (including 0) |
| 5B: | near? Y + adequate temperature? Y | adequate value (smaller than 5D, including 0) |
| 5C: | near? N + testing? Y | adequate value because of no need to adjust (incuding 0) |
| 5D: | near? N + testing? N | given value (for heating up to or maintaining at given temperature) |
| 6A: | testing? Y + adequate temperature? Y | adequate value because of no need to adjust (including 0) |
| 6B: | testing? Y + adequate temperature? N | adequate value (smaller than 6D, including 0) |
| 6C: | testing? N + adequate temperature? Y | adequate value because of no need to adjust (including 0) |
| 6D: | near? N + testing? N | given value (for heating up to given temperature) |

[Example by Combination of Three Determination Results]

| Form | Determination & results | Adjustment of power for heating |
|---|---|---|
| 7A: | near? Y + testing? Y + adequate temperature? Y | adequate value because of no need to adjust (including 0) |
| 7B: | near? Y + testing? Y + adequate temperature? N | adequate value (smaller than 7G, including 0) |
| 7C: | near? Y + testing? N + adequate temperature? Y | adequate value because of no need to adjust (including 0) |
| 7D: | near Y + testing N + adequate temperature? N | value for heating up to given temperature |
| 7E: | near? N + testing? Y + adequate temperature? Y | adequate adjustment (not existing in effect) |
| 7F: | near? N + testing? Y + adequate temperature? N | adequate value (not existing in effect) |
| 7G: | near? N + testing? N + adequate temperature? Y | adequate value because of no need to adjust, (including 0) |
| 7H: | near? N + testing? N + adequate temperature? N | value for heating up to given temperature |

In the following is explained more concrete examples of an embodiment of a method for controlling power for heating by the tester control portion 28.

(1) The tester control portion 28, when the chuck top 76 does not exist near the probe card 16, supplies the power for heating to the heating element 62 and, when the chuck top 76 exists near the probe card 16, adjusts the amount of the power supply for heating to an adequate value, for example, to a value smaller than the amount of supply when the chuck top 76 does not exist near the probe card 16. As a result, the probe card 16 is heated more effectively.

(2) The tester control portion 28, when undergoing a test, adjusts the amount of power supply for heating to a smaller value than that when the chuck top 76 does not exist near the probe card 16, particularly to 0. As a result, a test signal is less affected by the power for heating.

(3) The tester control portion 28, when the temperature of the probe card 16 is not adequate, adjusts the amount of power supply for heating to the heating element 62 to a smaller value than the amount of supply when, for example, the chuck top 76 does not exist near the probe card 16. This also makes the influence on a test signal by the power for heating less.

(4) The tester control portion 28 supplies the power for heating to the heating element 62 when the chuck top 76 does not exist near the probe card 16 and when the chuck top 76 exists near the probe card 16 but is not under testing.

(5) The tester control portion 28, when the chuck top 76 exists near the probe card 16 and under testing, adjusts the amount of power supply for heating to a value smaller than the amount of supply when the inspection stage does not exist near the probe card.

(6) The tester control portion 28, when the chuck top 76 does not exist near the probe card 16, supplies the power for heating to the heating element 62, and when the chuck top 76 exists near the probe card 16 and undergoing a test, and furthermore, when the temperature of the probe card 26 is not adequate, adjusts the amount of the power supply for heating to a value smaller than that when, for example, the chuck top 76 does not exist near the probe card 16.

The heating element 62 of each heat generating layer 58 generates heat at each site in the radial direction by supplying of the power for heating. Thus, the ceramic base plate 56, eventually, the probe base plate 40 is heated at each site in the radial and vertical directions, and is raised to a given temperature in a short time.

As a result of the above, the probe base plate 40 is heated in a short time to a temperature at which the thermal expansion rate of the probe base plate 40 becomes equal to the thermal expansion rate of the integrated circuit on the wafer 12, thereby significantly improving a test efficiency.

As mentioned above, an advantage of raising the probe base plate 56 in a short time to a given temperature is effective especially when the temperature of the probe base plate 56 is lower than the given temperature.

For instance, when the chuck top 76 is not under the probe card 16, the temperature of the probe base plate 16 is lowered to a value lower than a given value up to the time the chuck top 76 is moved to come under the probe card 16.

In such a case as above, testing of the integrated circuits on the wafer 12 may be suspended until the thermal expansion rate of the probe base plate 40 becomes approximately the same as the thermal expansion rate of the integrated circuits. This suspension period of testing greatly affects the test efficiency.

However, by the chuck top 76 and the probe card 16, as already mentioned, the probe base plate 40 is heated in a short time so that the thermal expansion rate of the probe base plate 40 may become equal to the thermal expansion rate of the integrated circuit on the wafer 12, thereby significantly shortening the suspension period of testing.

In place of using a heating element 62 having a unicursal or concentric circle-like (or spiral) pattern configuration, it is possible to use a heating element 62 having a spiral pattern form, or to use a heating element 62 having a concentric circle-like (or spiral) pattern form divided into plural parts).

Also, it is possible to angularly displace the patterns of the heat generating layers 58 adjacent in the vertical direction angularly about the central axis of the concentric circle or the spiral. Thus, the probe base plate 40 is heated uniformly at each site around the central axis of the concentric circle or the spiral.

To further uniform the heating of each site of the probe base plate 40, particularly, each site in the radial direction, it is possible to make the width dimension or the arrangement pitch of the sites of the heating element 62 different in the radial direction.

Figure 4:
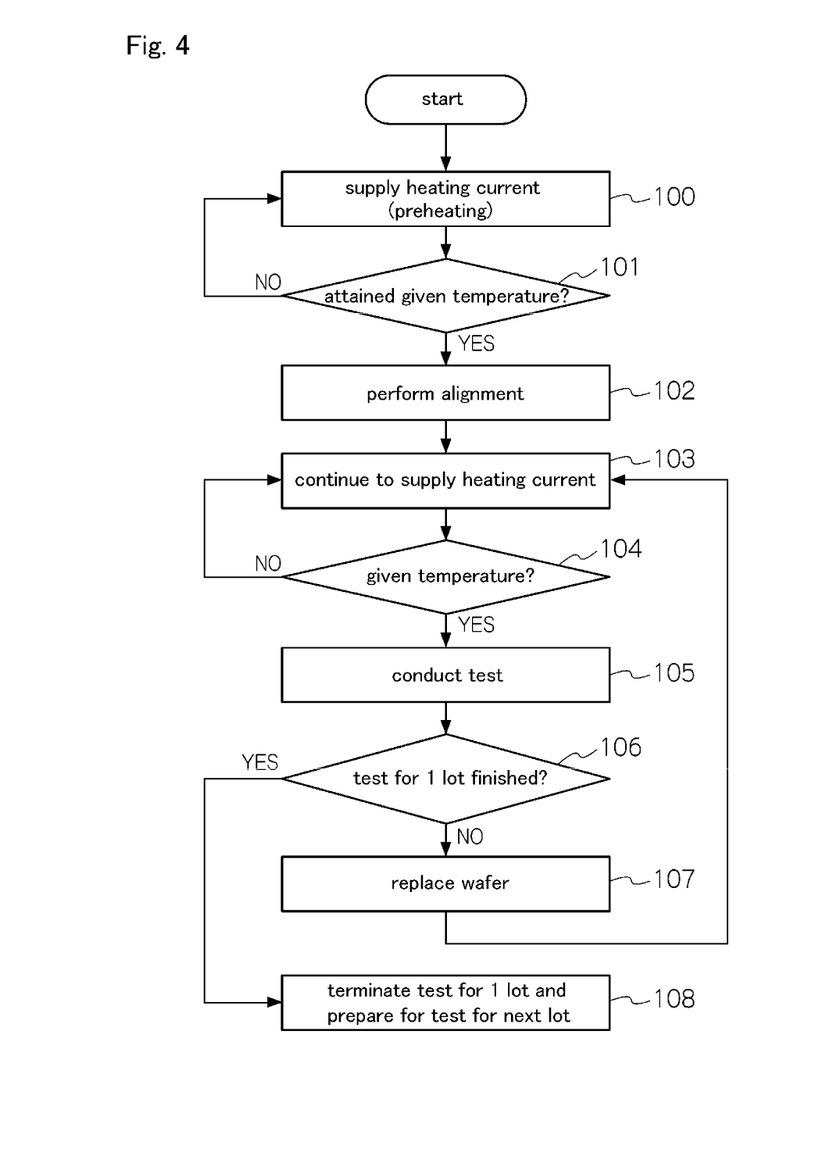
FIG. 4 is a flow chart for explaining an embodiment of a method of heating the probe card by the test apparatus shown in FIG. 1.

An embodiment of the method of heating the probe card 16 by the test apparatus 10 is further explained in the following with reference to FIG. 4.

The following explanation, it is supposed that the chuck top 76 is positioned under the probe base plate 40. Therefore, while the chuck top 76 does not exist near the probe base plate 40, the power for heating having a given value is supplied to the heating element 62.

Firstly, the test apparatus 10 supplies the power for heating to the heating element 62 prior to starting a test for 1 lot, and preheat the probe card 16 (step 100). The power for heating at this time is taken as a value for rapidly heating the probe card 16.

Secondly, the test apparatus 10 determines whether or not the probe card 16 is heated to a given temperature (step 101), and if not, returns to step 100.

However, as a result of determination of step 101, if the probe card 16 is heated to the given temperature, the test apparatus 10 moves the chuck top 76 by the chuck top moving mechanism 78 and carries out so-called alignment whereby the tips of the contacts 14 oppose the electrodes of the integrated circuits on the wafer 12 (step 102).

Thirdly, the power supply for heating to the heating element 62 is also continued during this time (step 103). The power for heating at this time is set at a value smaller than the value in step 101.

Then, it is again determined whether or not the probe card 16 has reached a given temperature (step 104), and if not reached, step 103 is again tried.

However, if the given temperature is attained, the test apparatus 10 conducts an electrical test of the integrated circuits on the wafer 12 received in the chuck top 76 (step 105).

In step 105, the power supply for heating to the heating element 62 is suspended according to the temperature of the probe card to maintain at a value smaller than the value in step 100 or 102, thereby minimizing the influence of the power for heating on a test signal.

Then, the test apparatus 10 determines whether or not the test on the wafer 12 for one lot has finished (step 106).

If the test for 1 lot is not finished, the test apparatus 10 undergoes replacement of the wafer 12 for testing (step 107) and then returns to step 103.

However, if the test for one lot is finished, the test apparatus 10 terminates the test for the lot and prepares for a test on the wafer 12 for the next lot (step 108).

When the preparation for the test of the wafer for the next lot is completed, the test apparatus 10 returns to step 102. Also, when the test of all lots are completed, the action terminates.

In steps 100 through 108, supply of the power for heating to the heating element 62 is performed during steps 100 through 104 and steps 105 through 108 according to the temperature of the probe card 16, whether or not being tested and the like.

Such control and adjustment of the power for heating can be performed as described in Tables (1) through (7) above.

The heat generating layer 58 is not necessarily multi-layered but may be single-layered. It is also possible to provide the heat generating layer 58 on a base plate other than the ceramic base plate 56. Further, it is possible to use a heating element having another configuration or structure in place of using the heating element 62 having the illustrated pattern configuration.

In case where only part of the chuck top 76 is positioned on the underside of the probe card 16, it is possible to provide plural temperature fuses 82, plural overheat prevention members 86 and plural stage sensors 88, respectively, in order to detect accurately the position of the chuck top 76 relative to the probe card 16. Particularly, it is possible to provide plural temperature sensors 84 or plural stage sensors 88.

While in the illustration the temperature fuses 82, temperature sensors 84, overheat prevention members 86 and stage sensors 88 are provided on the upside or underside of the ceramic base plate 56, all or at least one of them may be disposed inside the ceramic base plate 56.

While in the illustration the temperature fuses 82, temperature sensors 84, overheat prevention members 86 and stage sensors 88 are provided, it is possible to provide one or two of them, and at least one of them may be disposed on the ceramic base plate 56.

In an embodiment of the present invention, in brief, it is possible to control the power for heating by providing either the temperature sensors 84 or the stage sensors 88, or both sensors 84, 88 and using either one of the output signals and whether or not a test is being conducted as well as both of the output signals and whether or not a test is being conducted.

The described matter is not limited to the above embodiments but may be altered in various ways without departing from the spirit and scope presented here.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method of conducting an electrical test of an integrated circuit, comprising:
   a first step for determining at least one selected from a group including whether or not a chuck top for receiving said integrated circuit exists near a probe card for transmitting and receiving electrical signals relative to said integrated circuit, whether or not said integrated circuit is under test, and whether or not said probe card has an adequate temperature;
   a second step for adjusting power for heating to be supplied to a heating element provided in said probe card according to a determination result in said first step;
   wherein said probe card includes a probe base plate, the probe base plate having a multilayer ceramic base plate and a flexible multilayer sheet provided on the underside of the ceramic base plate, and said ceramic base plate including a plural of heating layers as said heating element; and
   wherein said probe card is heated by said heating element so that the thermal expansion rate of said probe card may become approximately the same as the thermal expansion rate of said integrated circuit during testing of the integrated circuit.

2. The method of testing according to claim 1, wherein said first step includes determining whether or not said chuck top exists near said probe card, on the basis of an output signal of a sensor provided in said probe card or said chuck top.

3. The method of conducting an electrical test according to claim 1,
   wherein said first step includes determining whether or not said chuck top exists near said probe card, and
   wherein said second step includes adjusting said power for heating to be supplied to said heating element to a given value when said chuck top does not exist near said probe card.

4. The method of conducting an electrical test according to claim 3, wherein said second step further includes adjusting said power for heating to be supplied to said heating element when said chuck top exists near said probe card.

5. The method of conducting an electrical test according to claim 1,
   wherein said first step includes determining whether or not said test is being conducted, and
   wherein said second step includes adjusting said power for heating to be supplied to said heating element to an adequate value when said test is not being conducted.

6. The method of conducting an electrical test according to claim 5, wherein said second step further includes adjusting said power for heating to be supplied to said heating element to an adequate value when said test is being conducted.

7. The method of conducting an electrical test according to claim 1,
   wherein said first step includes determining whether or not said probe card has a given temperature, and
   wherein said second step includes adjusting said power for heating to be supplied to said heating element to a given value when said probe card does not have a given temperature.

8. The method of conducting an electrical test according to claim 7, wherein said second step further includes adjusting said power for heating to be supplied to said heating element to 0 when said probe card has a given temperature.

9. The method of conducting an electrical test according to claim 1,
   wherein said first step includes determining whether or not said chuck top exists near said probe card, and
   wherein said second step includes adjusting the supply of said power for heating to said heating element to a given value when said chuck top neither exists near said probe card nor is under testing.

10. The method of conducting an electrical test according to claim 9, wherein said second step further includes adjusting the amount of supply of said power for heating to said heating element to an adequate value when said chuck top exists near said probe card but is not under testing.

11. The method of conducting an electrical test according to claim 1,
    wherein said first step includes determining whether or not said chuck top exists near said probe card and whether or not said temperature is adequate, and
    wherein said second step includes adjusting the amount of supply of said power for heating to said heating element to a given amount when said chuck top neither exists near said probe card nor said temperature is adequate.

12. The method of conducting an electrical test according to claim 10, wherein said second step further includes adjusting the amount of supply of said power for heating to said heating element to a given value when said chuck top exists near said probe card but said temperature is not adequate.

13. The method of conducting an electrical test according to claim 1,
    wherein said first step includes determining whether or not said test is being conducted and whether or not said temperature is adequate, and
    wherein said second step includes adjusting the supply of said power for heating to said heating element to a given value.

14. The method of conducting an electrical test according to claim 13, wherein said second step includes adjusting the amount of supply of the power for heating to said heating element to an adequate value when the test is being conducted and the adequate temperature is not attained.

15. The method of conducting an electrical test according to claim 1,
    wherein said first step includes determining whether or not said chuck top exists near said probe card, whether or not the test is being conducted, and whether or not the temperature of said probe card is adequate, and
    wherein said second step includes adjusting the amount of supply of the power for heating to a given value when said chuck top neither exists near said probe card nor under testing and further the temperature is not adequate.

16. The method of conducting an electrical test according to claim 1,
    wherein said first step includes determining whether or not said chuck top exists near the probe card, whether or not the test is being conducted, and whether or not the temperature of said probe card is adequate, and
    wherein said second step includes adjusting the amount of supply of the power for heating to an adequate value when the chuck top exists near the probe card, under testing, and further when the temperature is not adequate.

17. The method of conducting an electrical test according to claim 1, further comprising supplying the power for heating from an electric source circuit selected from those other than said electric source circuit for said probe card and said electric source circuit for said probe card.

18. An electrical test apparatus for testing an integrated circuit, comprising:
    a probe card including a probe base plate having a plurality of electrically conducting paths and power supply paths, and a plurality of contacts arranged on one face of said probe base plate and having a plurality of contacts electrically connected to said electrically conducting paths, wherein the probe base plate has a multilayer ceramic base plate and a flexible multilayer sheet provided on the underside of the ceramic base plate;

a chuck top in which said integrated circuit is to be disposed is movable among a test site where the received integrated circuit opposes said probe card, a non-test site where the received integrated circuit does not oppose said probe card, and a retreat position where the received integrated circuit does not oppose said probe card;

a heating element in the ceramic base plate, the heating element including a plurality of heating layers operable to generate heat by a power for heating to be supplied through said power supply path;

a first sensor for outputting an electrical signal for use in determining whether or not said chuck top is located near said probe card;

a second sensor disposed in said probe card to detect temperature of said probe card; and a controller for controlling a test signal to be supplied to said probe card and power for heating to be supplied to said heating element, and adjusting the amount of supply of said power for heating by determining at least one selected from a group including whether or not said chuck top exists near said probe card on the basis of an output signal of said first sensor, whether or not said test signal is supplied to said integrated circuit, and determining, on the basis of an output signal of said second sensor, whether or not said probe card has a given temperature, and according to a determination result, adjusting the amount of the supply of the power for heating, wherein said controller controls the power to said heating element so that the thermal expansion rate of said probe card may become approximately the same as the thermal expansion rate of said integrated circuit.

19. An electrical test apparatus of an integrated circuit, comprising:

a probe card including a probe base plate having a plurality of electrically conductive paths as well as power supply paths and a plurality of contacts which are arranged on one face of said probe base plate and electrically connected to said conductive paths, wherein the probe base plate has a multilayer ceramic base plate and a flexible multilayer sheet provided on the underside of the ceramic base plate;

a chuck top in which said integrated circuit is to be disposed is movable among a test site where the received integrated circuit opposes said probe card, a non-test site where the received integrated circuit does not oppose said probe card, and a retreat position where the received integrated circuit does not oppose said probe card;

a heating element contained in the multilayer ceramic base plate, the heating element including a plurality of heating layers operable to generate heat by a power for heating supplied through said power supply paths;

a sensor which outputs an electrical signal to be used for determining whether or not said chuck top exists near said probe card; and a controller for controlling a test signal to be supplied to said probe card and controlling power for heating to be supplied to said heating element, determining, on the basis of the output signal of said sensor, whether or not said chuck top exists near said probe card and whether or not said test signal is supplied to said integrated circuit, and, according to both determination results, adjusting the amount of supply of said power for heating, wherein said controller controls the power to said heating element so that the thermal expansion rate of said probe card may become approximately the same as the thermal expansion rate of said integrated circuit.

20. An electrical test apparatus for testing an integrated circuit, comprising:

a probe base plate having a plurality of electrically conducting paths and power supply paths as well as a probe card disposed on one face of said probe base plate and including a plurality of contacts electrically connected to said conductive paths wherein the probe based plate includes a multilayer ceramic base plate and a flexible multilayer sheet provided on the underside of the multilayer ceramic base plate;

a chuck top in which said integrated circuit is to be disposed is movable among a test site where the received integrated circuit opposes said probe card, a non-test site where the received integrated circuit does not oppose said probe card, and a retreat position where the received integrated circuit does not oppose said probe card;

a heating element of the multilayer ceramic base plate including a plurality of heating layers operable to generate heat by the power for heating to be supplied through said power supply paths;

a sensor disposed in said probe card to detect temperature of said probe card; and a controller for controlling a test signal to be supplied to said probe card and controlling power for heating to be supplied to said heating element, determining, on the basis of an output signal of said sensor, whether or not said test signal is supplied to said integrated circuit and, on the basis of an output signal of said sensor, whether or not said probe card has a given temperature, and according to both determination results, adjusting the amount of supply of said power for heating, wherein said controller controls the power to said heating element so that the thermal expansion rate of said probe card may become approximately the same as the thermal expansion rate of said integrated circuit.

* * * * *

UNITED STATES PATENT AND TRADEMARK OFFICE
CERTIFICATE OF CORRECTION

PATENT NO.       : 8,680,880 B2
APPLICATION NO.  : 12/637656
DATED            : March 25, 2014
INVENTOR(S)      : Hidehiro Kiyofuji et al.

It is certified that error appears in the above-identified patent and that said Letters Patent is hereby corrected as shown below:

In the Claims

In Claim 1, Column 15, line 18, the phrase "including a plural of heating layers" should read --including a plurality of heating layers--

In Claim 20, Column 18, line 25, the phrase "to said conductive paths wherein the probe based plate includes" should read --to said conductive paths wherein the probe base plate includes--

Signed and Sealed this
Twenty-fourth Day of February, 2015

Michelle K. Lee
*Deputy Director of the United States Patent and Trademark Office*